United States Patent
Gatherer et al.

(10) Patent No.: US 7,020,827 B2
(45) Date of Patent: Mar. 28, 2006

(54) CASCADE MAP DECODER AND METHOD

(75) Inventors: Alan Gatherer, Richardson, TX (US); Tod D. Wolf, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 414 days.

(21) Appl. No.: 10/032,859

(22) Filed: Dec. 28, 2001

(65) Prior Publication Data

US 2003/0140305 A1   Jul. 24, 2003

Related U.S. Application Data

(60) Provisional application No. 60/296,978, filed on Jun. 8, 2001.

(51) Int. Cl.
H03M 13/03 (2006.01)
H03M 13/00 (2006.01)

(52) U.S. Cl. .................................. 714/786; 714/755

(58) Field of Classification Search ................ 714/794, 714/796, 786, 755, 795
See application file for complete search history.

(56) References Cited

U.S. PATENT DOCUMENTS 5,933,462 A   8/1999  Viterbi et al. ............... 375/341
6,477,681 B1 * 11/2002 Taipale et al. ............... 714/795
6,516,437 B1 *  2/2003 Van Stralen et al. ......... 714/755
6,594,792 B1 *  7/2003 Hladik et al. ................ 714/755
6,606,725 B1 *  8/2003 Wang et al. ................. 714/755
6,675,342 B1 *  1/2004 Yagyu ......................... 714/755

OTHER PUBLICATIONS

Design of Viterbi Decoders with In-Place State Metric Update and Hybrid Traceback Processing; Ching-Won Wang et al.; Conference Proceedings; Sep. 26, 2001; pp. 5-15.
A Unified Approach to The Viterbi Algorithm State Metric Update for Shift Register Processes; Black, P. J. et al.; Proceedings of the International Conference on Acoutics, Speech and Signal Processing; Mar. 23, 1992; pp. 629-632.
A Turbo Code Tutorial; Ryan, T. E.; Proc. IEEE Global Telecommunications Conference; Nov. 3, 2001; pp. 1-9.

* cited by examiner

*Primary Examiner*—Albert Decady
*Assistant Examiner*—Esaw Abraham
(74) *Attorney, Agent, or Firm*—Carlton H. Hoel; W. James Brady; Frederick J. Telecky, Jr.

(57) ABSTRACT

MAP decoder with cascade architecture. Iterative Turbo decoders can use two such cascade MAP decoders with feedback in conjunction with interleaver and deinterleaver where the MAP decoders generate extrinsic information for iterations. The cascade architecture limits the required number of max* blocks which compute the logarithm of a sum of exponentials as part of the BCJR method.

7 Claims, 17 Drawing Sheets cascade extrinsic subblock $\log[\Sigma_{states} \exp(A_{k-1} + \Gamma_k + B_k)]$ Figure 2d beta block (prior art)
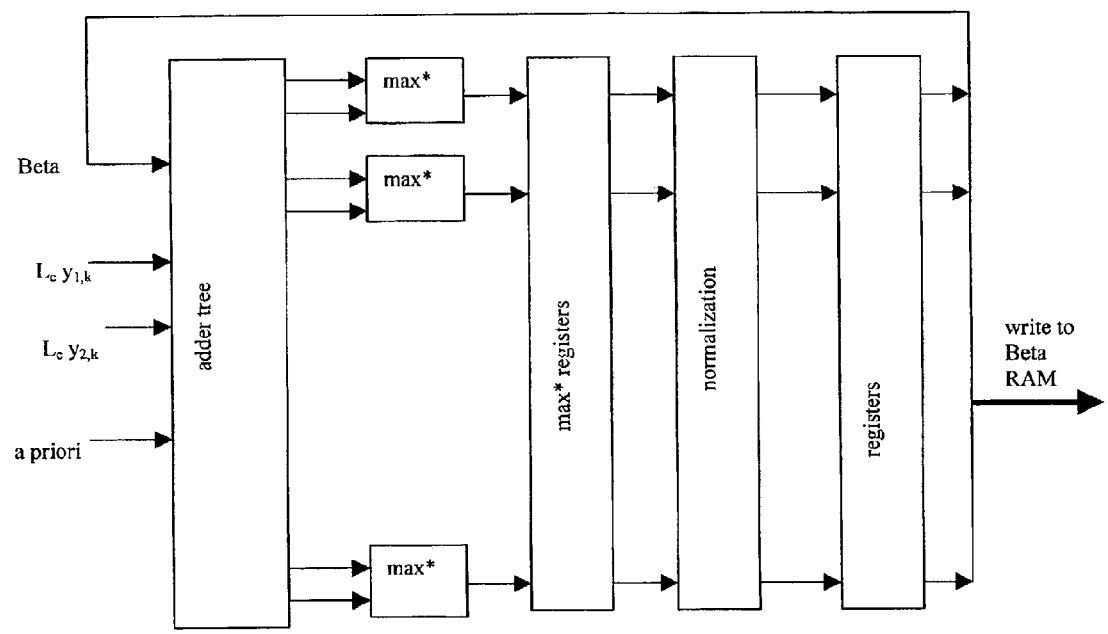

Figure 2e  alpha block (prior art)
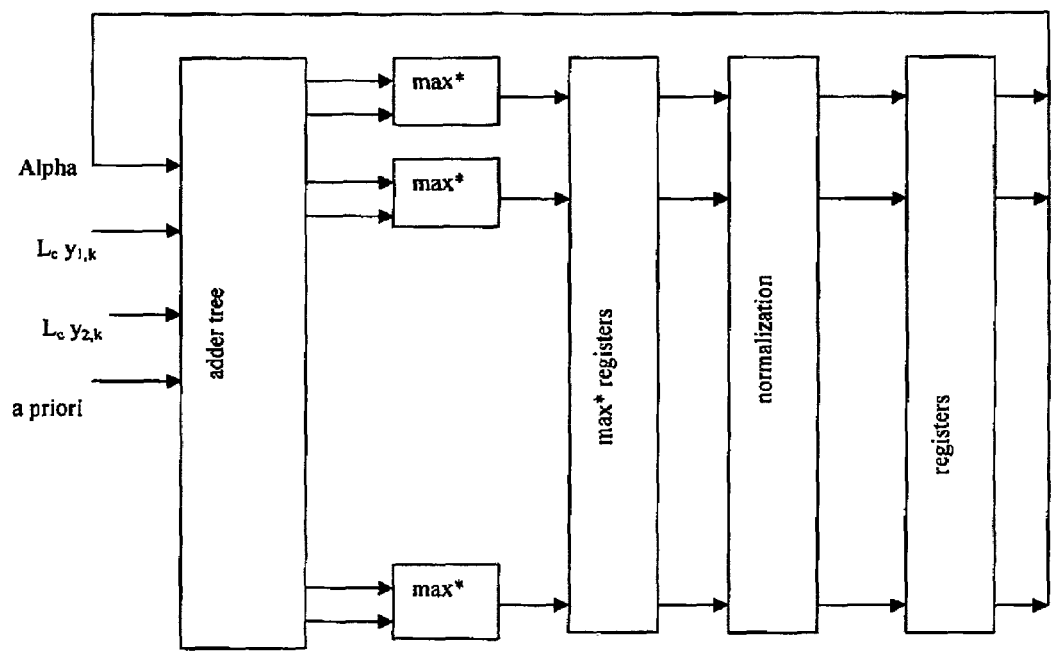

Figure 2f  extrinsic block (prior art)
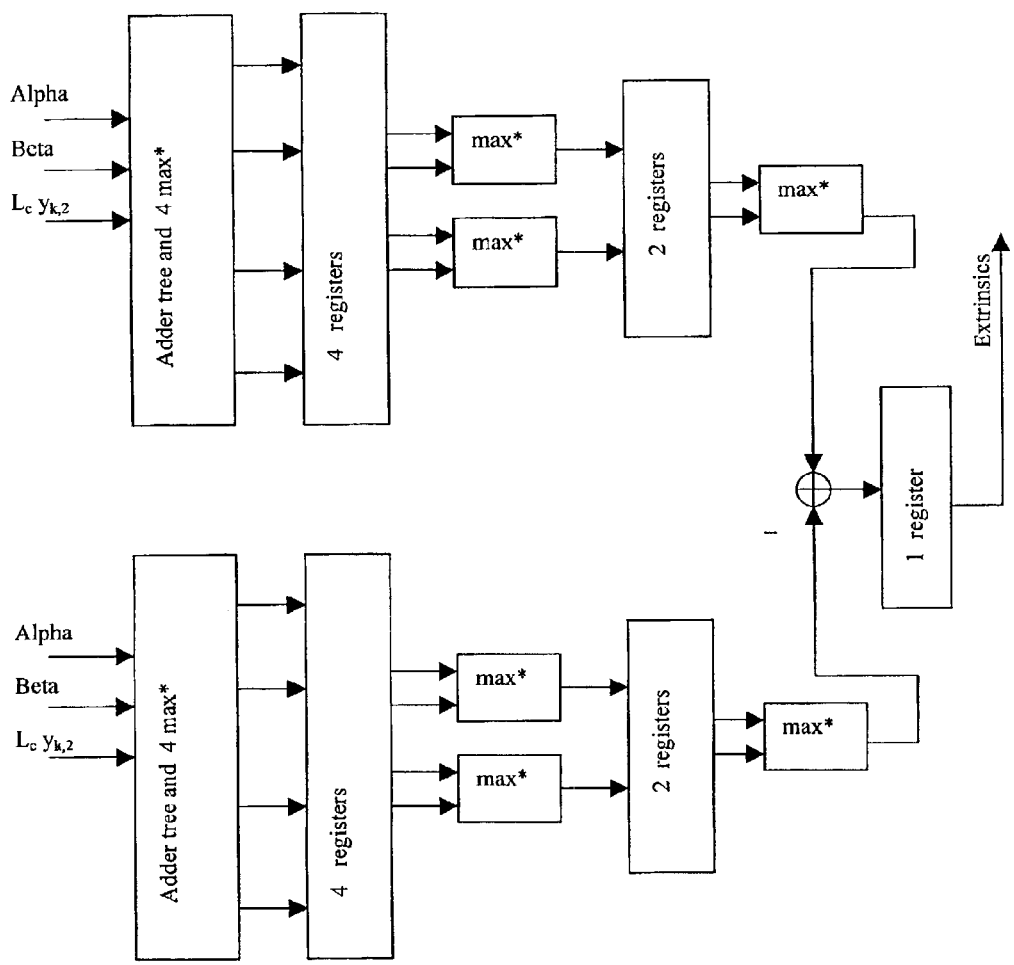

Figure 2g adder plus max* circuit (prior art)
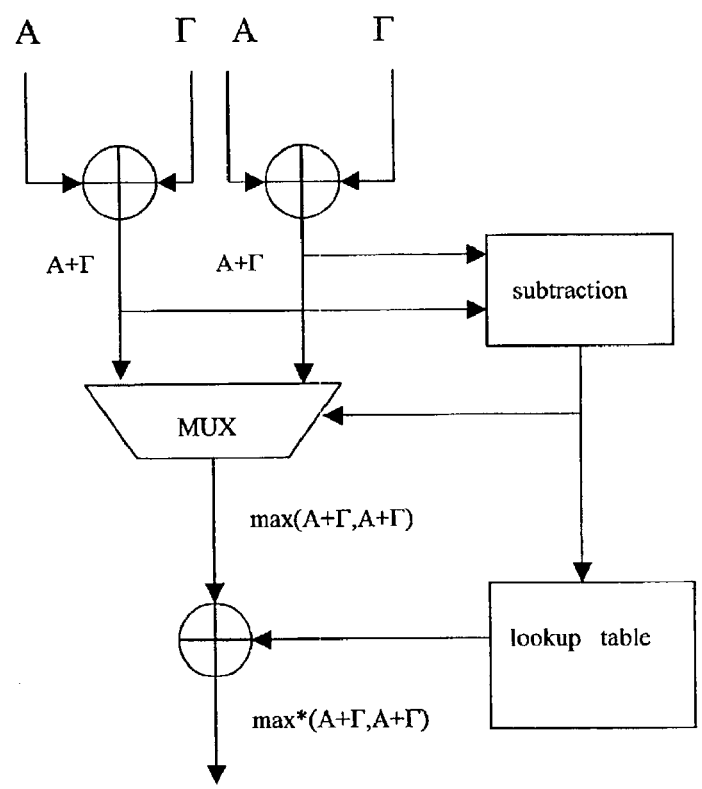

Figure 3a  alpha block
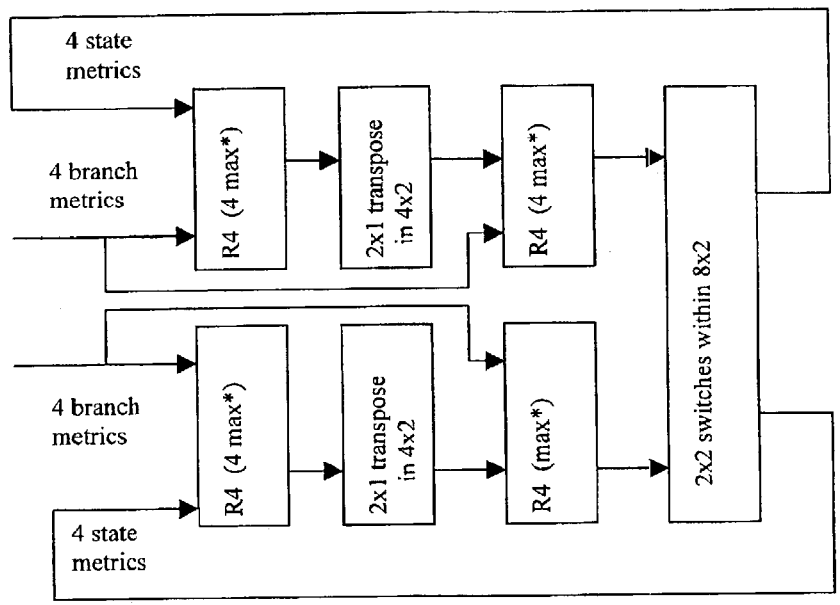
Figure 3b
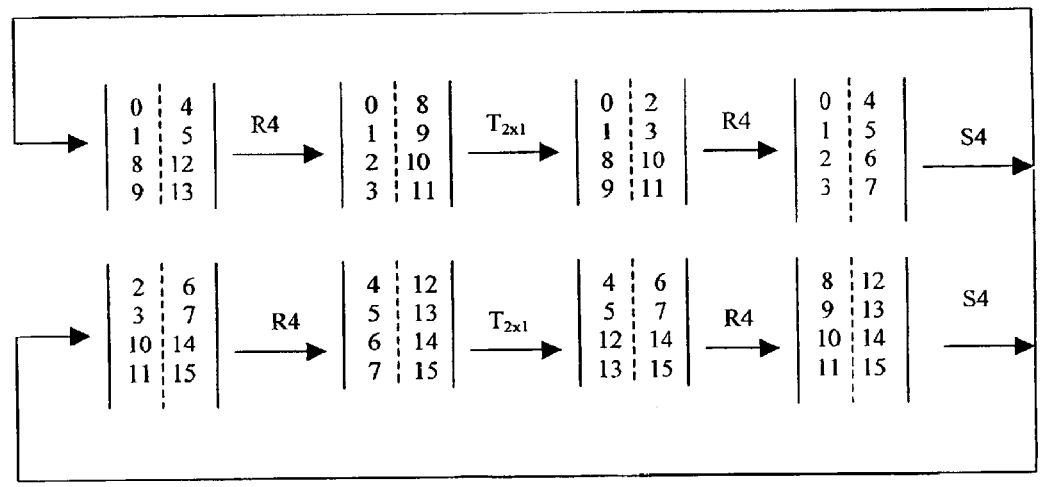

Figure 3c  first architecture beta block
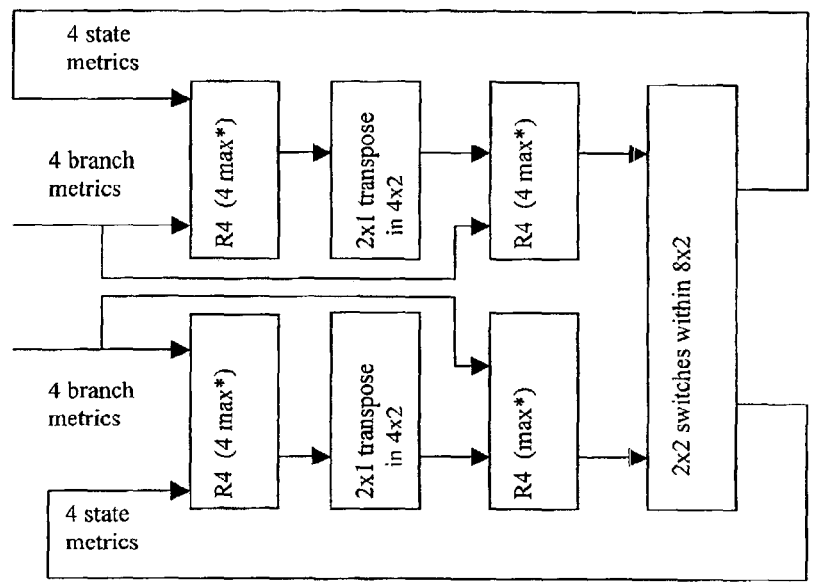
Figure 3d
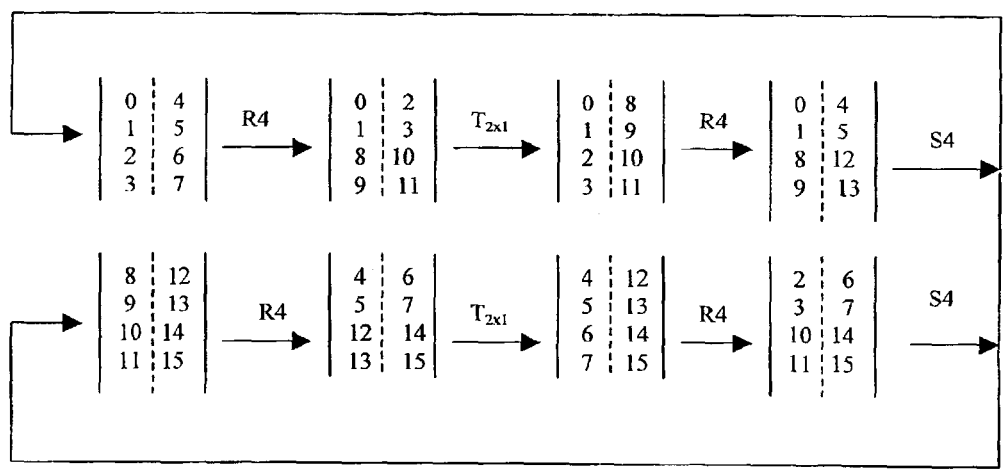

Figure 3e second architecture beta block
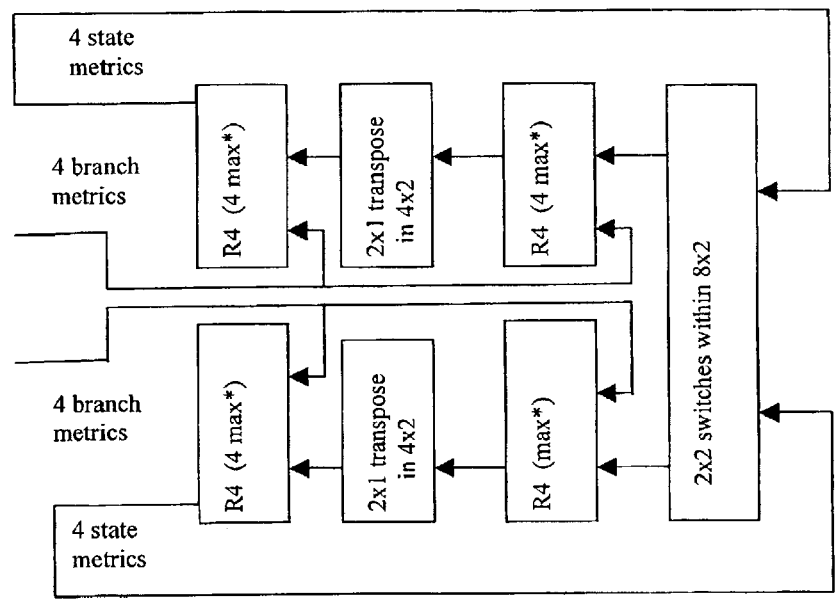
Figure 3f
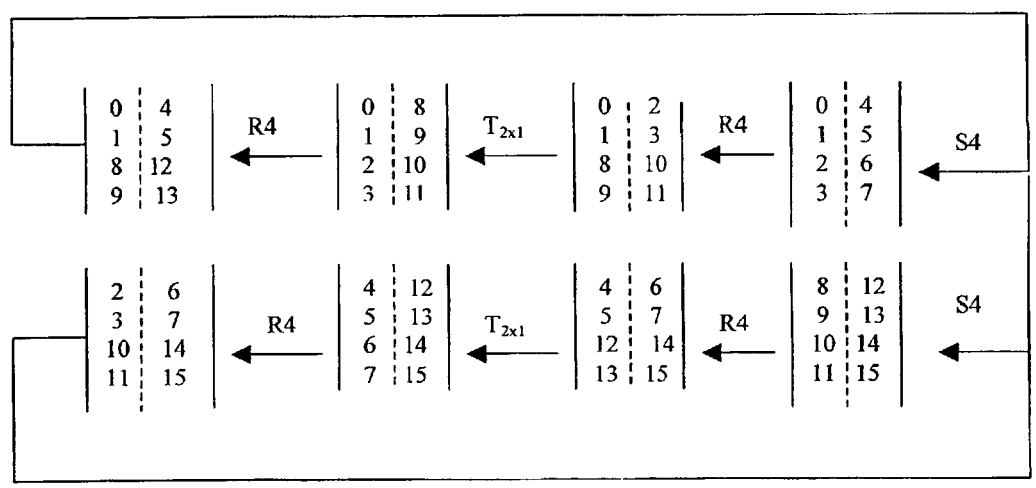

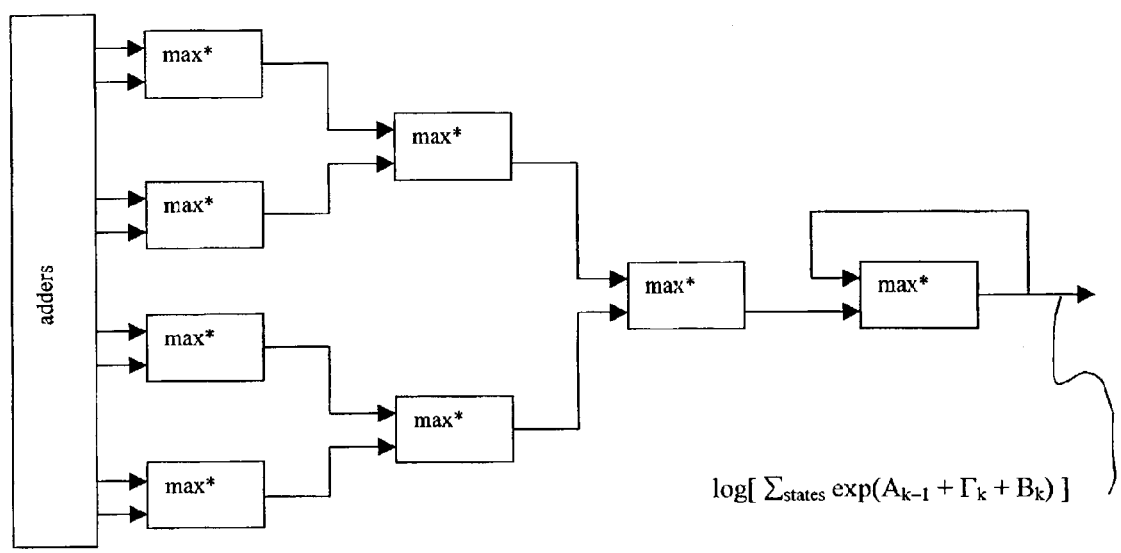
Figure 3g cascade extrinsic subblock

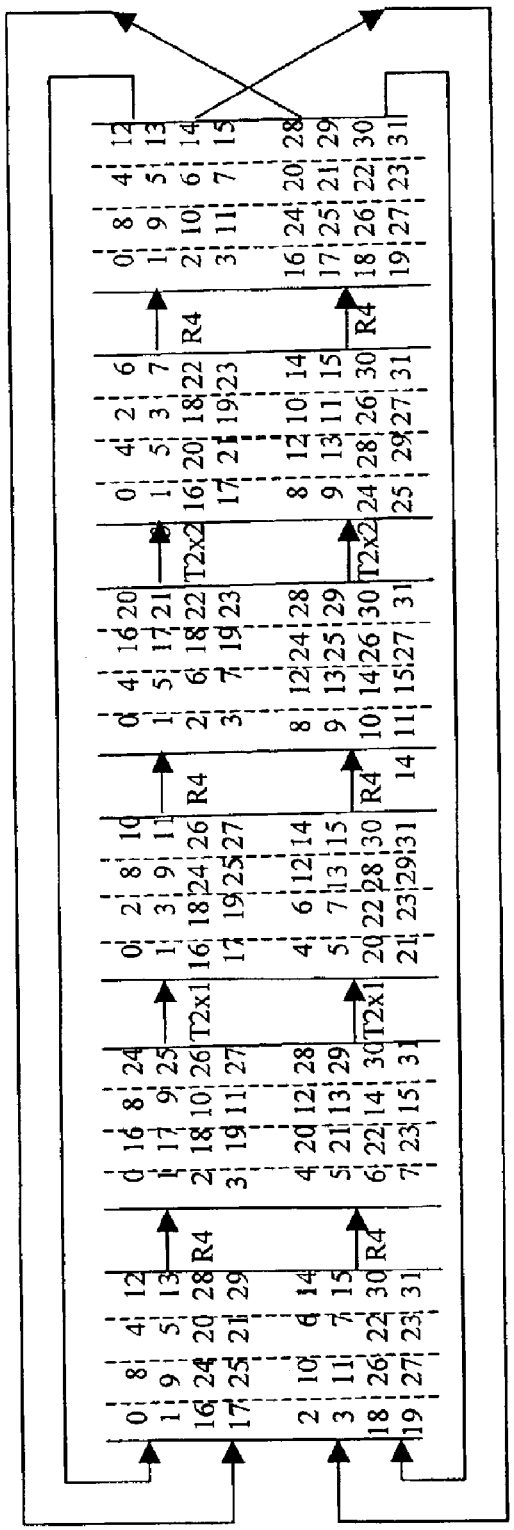
Figure 4 alpha block

Figure 5a alpha block
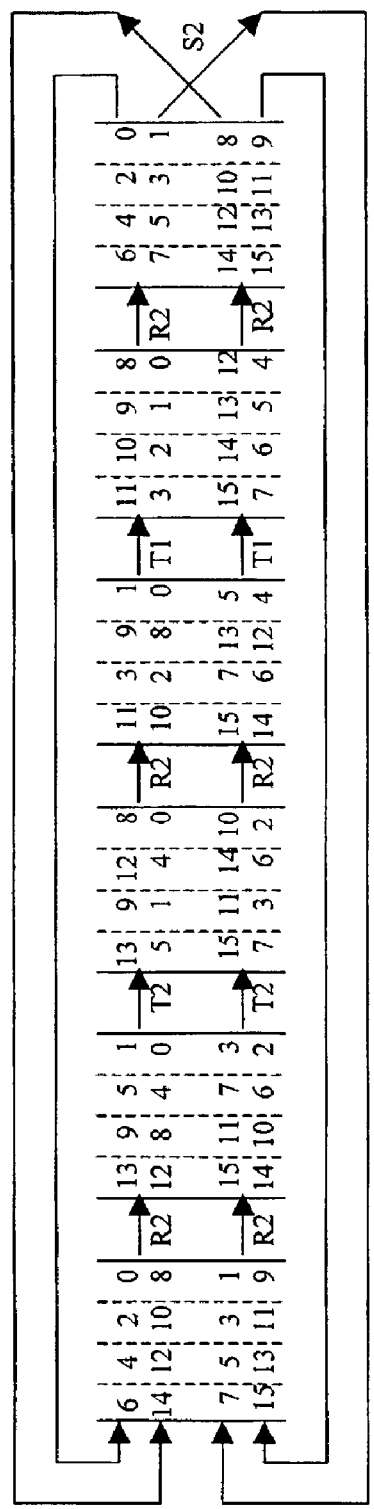

Figure 5b beta block
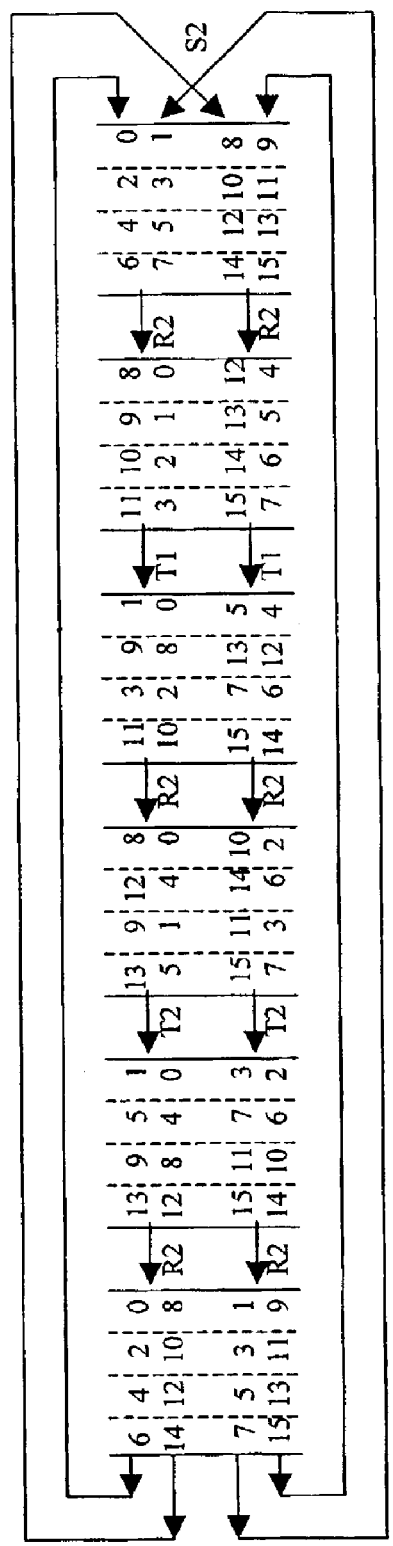

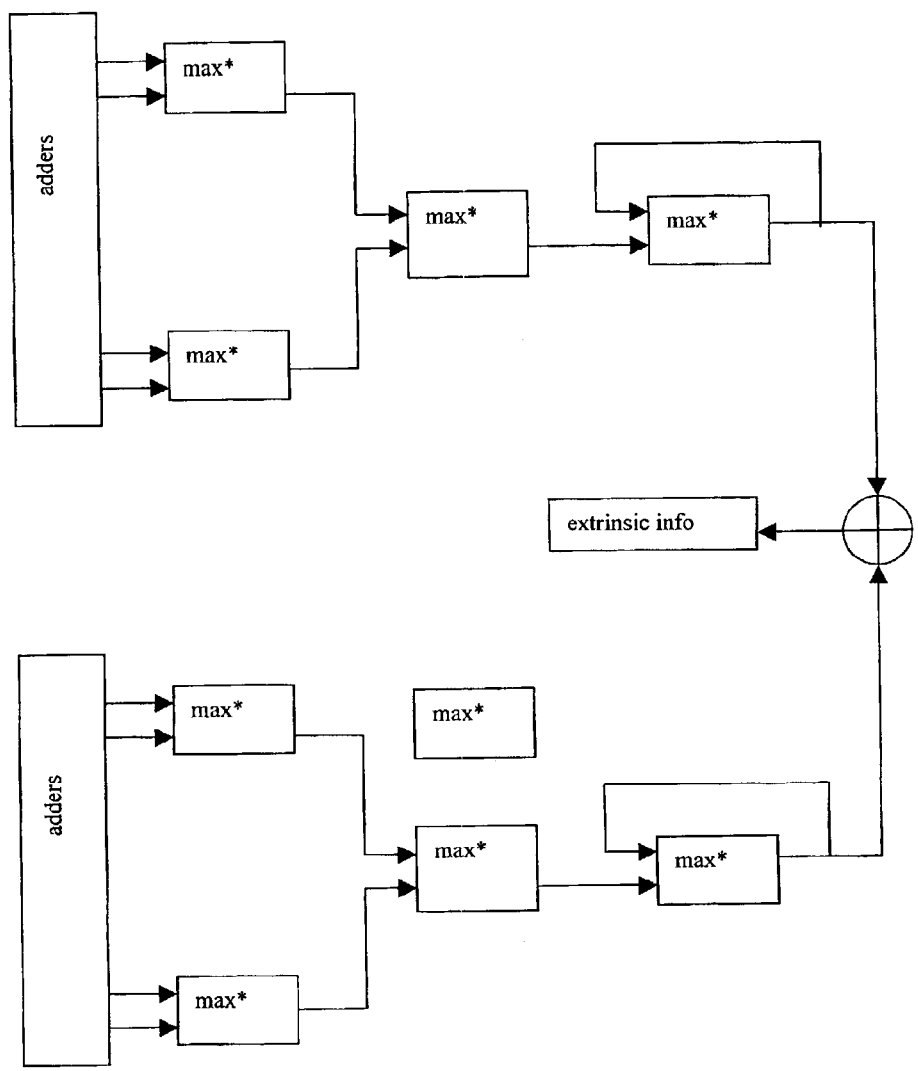
Figure 5c extrinsics block

CASCADE MAP DECODER AND METHOD

CROSS-REFERENCE TO RELATED APPLICATIONS

This application claims priority from the following provisional application: Ser. No. 60/296,978, filed Jun. 08, 2001. Application Ser. No. 10/033,135, filed Dec. 28, 2001, now U.S. Pat. No. 6,603,412, discloses related subject matter. These applications have a common assignee.

BACKGROUND OF THE INVENTION

1. Field of the Invention

The invention relates to channel encoding and decoding, and more particularly to interleaved codes such as turbo codes with iterative decoding and related systems.

2. Background

Demand for wireless information services via cell phones, personal digital assistants (PDAs), and Internet appliances (IA) plus wireless networking among notebook computers is rapidly growing. However, the air interface in wireless communication typically has a large bit error rate due to effects such as noisy channels with multipath fading.

Channel coding for the air interface transmission channel using CDMA (code division multiple access) together with reception schemes such as rake detectors help mitigate the error rate. In particular, third generation wireless proposals include channel coding of data packets with rate 1/3 turbo codes. Turbo codes are parallel concatenated convolutional codes with an interleaving between the parallel codes. FIG. 2a illustrates the wireless standard UMTS/3GPP turbo encoder (the trellis termination connections have been omitted for clarity). The interleaver essentially randomly permutes the input data within a block; this permutation underlies the good coding performance because close together inputs bits are spread apart by the interleaving.

Cascade architectures for Viterbi decoders have been described in Feygin et al, Generalized Cascade Viterbi Decoder—a Locally Connected Multiprocessor with Linear Speed-Up, Proc. ICASSP-91 1097 (1991) and Black et al, A Unified Approach to the Viterbi Algorithm State Metric Update for Shift Register Processes, Proc. ICASSP-92 V-629 (1992). Viterbi decoding can be applied to Turbo codes.

FIG. 2b illustrates an iterative MAP (maximum a posteriori probability) decoder consisting of repeated applications of computations based on the trellises of the two constituent convolutional codes and the interleaver of the encoder of FIG. 2a. MAP decoding is more complex than but provides better performance than Viterbi decoding. U.S. Pat. No. 6,023,783 (Divsalar) discloses various turbo encoders and decoders, and Hagenauer et al, Iterative Decoding of Binary Block and Convolutional Codes, 42 IEEE Tr.Info.Th. 429 (1996) describes the soft iterative MAP decoding.

SUMMARY OF THE INVENTION

The present invention provides a MAP decoder with cascade architecture.

This has advantages including preferred embodiments with faster or simpler turbo encoding/decoding.

BRIEF DESCRIPTION OF THE DRAWINGS

The drawings are heuristic for clarity.

FIGS. 2a–2g illustrate a MAP decoder.

FIGS. 3a–3g, 4, and 5a–5c illustrate preferred embodiment MAP decoders.

DETAILED DESCRIPTION OF THE PREFERRED EMBODIMENTS

1. Overview

Preferred embodiment communication systems incorporate preferred embodiment encoding and decoding methods and include Turbo code interleavers with output memory partitioned into banks for quasi-parallel read/writes plus MAP decoders with reduced complexity cascade circuitry. In particular, preferred embodiment interleavers permute data by reading in chunks of data and writing in parallel into banks up to an address contention at a bank. The larger the number of banks (and corresponding write circuits), the larger the chunk size and the greater the average number of parallel writes.

Preferred embodiment cascade MAP decoders allow for reduction in the number of circuits as compared to parallel MAP decoders by partitioning the states into subsets and performing the computation of a trellis stage one subset at a time. The cascade MAP decoder may use fewer circuits than the parallel MAP decoder because the cascade MAP decoder can use the same circuit for the computations of multiple states.

Preferred embodiment wireless communications systems components, base stations and mobile users, could each include one or more application specific integrated circuits (ASICs), (programmable) digital signal processors (DSP's), and/or other programmable devices with stored programs for control of the preferred embodiment interleavers and cascade MAP decoders. The base stations and mobile users may also contain analog integrated circuits for amplification of inputs to or outputs from antennas and conversion between analog and digital; and these analog and processor circuits may be integrated on a single die. The stored programs may, for example, be in external or onboard ROM, flash EEPROM, and/or FeRAM. The antennas may be parts of RAKE detectors with multiple fingers for each user's signals. The DSP core could be a TMS320C6xxx or TMS320C5xxx from Texas Instruments.

2. First Preferred Embodiment Interleavers

Figure 1A:
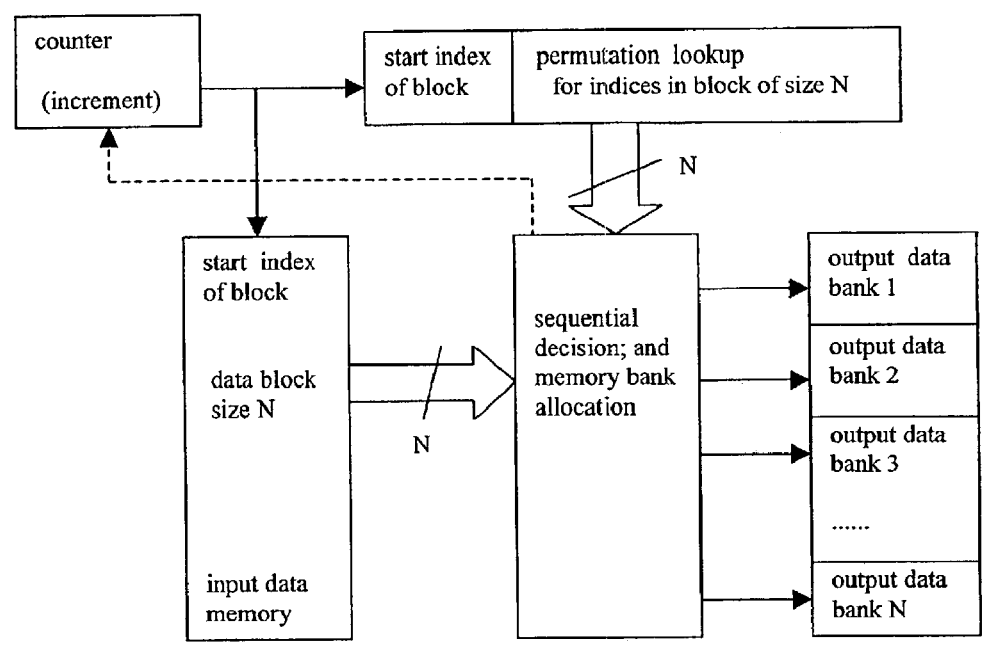
FIGS. 1a–1b show preferred embodiment interleavers.

FIG. 1a illustrates first preferred embodiment implementations of a "random" interleaver using a preferred embodiment memory bank architecture. A random interleaver will pseudo-randomly spread data points which are originally close together; indeed, the further apart the data is spread, the more effective iterative decoding process. Hence, it is not possible to access N data points at a time and also store N data points at a time, as N points that are consecutive in memory before interleaving will be randomly spread over a wide memory area after interleaving. For example, a simple interleaver which writes an input data block into an R×C matrix row by row and then reads out the data column by column will usually separate two adjacent input data points by R data points in the output. As a more random example, the UMTS/3GPP turbo encoder interleaver (see FIG. 2a) writes an input data sequence (block) into a matrix, row by row, permutes the data within each row with the permutation depending upon the row, then permutes the rows, and lastly reads out the data column by column. In particular, an input block of 2000 bits leads to a matrix with 20 rows and 100 columns. First, permute the bits within the jth row (j=0, 1, ..., 19) so that the bit in the ith column was originally in column number c(i*$p_j$ mod 100)_1 where $p_j$ is the jth prime from a minimal set having no common divisors with 100 (the pattern $P_A$ permutation of the set {1, 7, 11, ... ,79}) and c(n) is a sequence generated as c(0)=1 and recursively c(n)=2*c(n−1) mod 101 for n=1, 2, . . . , 99. Next, permute the rows by pattern $P_A$ which is a permutation of the numbers 0, 1, 2, . . . , 19. Lastly, read out the bits from the thus-permuted matrix column by column.

An implementation of such interleavers would typically have a first memory space for the input data block {x(n)}, a second memory space for the output interleaved data block {x'(n)} with x'(m)=x(n) where m=π(n) is the interleaving permutation, and a lookup table or special circuit to compute the permutation π(n) of input data index n (location in the first memory) to generate the output data index (location in the second memory). Thus the interleaving reads input data from location n in the first memory space, computes the index permutation π(n), and writes that data to location π(n) in the second memory space. And when the interleaver is being used in an iterative decoding (see FIG. 2b), the computations of branch metrics and probabilities between interleavings and de-interleavings may be parallelized, so the interleavers serial reading and writing of the data block becomes the speed bottleneck. Note that for the encoding the data are bits, but for decoding the data are the received (quantized) analog signals. Thus for a decoder the memory spaces may be on the order of 5K words.

The first preferred embodiment memory architecture (see FIG. 1a) permits quasi-parallel read/writes for an interleaver by a partition of the interleaver output memory into N banks where N may be a small positive integer such as 5. Each output memory bank can be written to independently of the other banks; that is, parallel writes are possible. The preferred embodiments exploit the combination of the possibility of parallel writes to the N data banks and the random spreading of N consecutive input data indices by the interleaving index permutation and operate as follows.

(1) Read (in parallel) N consecutive data entries from the input data memory, x(n), x(n+1), . . . , x(n+N−1), with the starting index n determined by a counter; initially, the counter is set to point to the beginning of the data block.

(2) Compute the index permutations, π(n), π(n+1), . . . , π(n+N−1), such as by reading N consecutive entries from a permutation lookup table or special circuit;

(3) Send π(n),x(n) to the write circuit of the output memory bank for addresses than include the index π(n), send π(n+1),x(n+1) to the write circuit of the output memory bank for addresses including the index π(n+1), and so forth through π(n+M_1), x(n+M_1) to the write circuit of the output memory bank for the index π(n+M_1) where π(n+M) is the first index which lies in the addresses of a memory bank of one of the prior indices π(n), π(n+1), . . . , π(n+M_1). In the case that the indices π(n), π(n+1), . . . , π(n+N_1) lie in the address spaces of separate memory banks, M=N. These M data are written to the corresponding locations in the memory banks. A decision circuit can perform the sequential index contention checking and allocation to the memory banks. For example, if N=$2^k$, then the k most significant address bits could identify a memory bank, and the decision circuit could check the k most significant bits of π(n+j) and then either set a flag for the corresponding memory bank if it had not previously been written to or determine the flag had already been set and clear all flags and proceed to step (4).

(4) Update the counter in step (1) from n to n+M and loop to step (1) unless all of the data block has been interleaved and stored in the output memory banks. That is, loop until the counter exceeds the end of the address of the input data block.

Simulations for block sizes 320 and 5120 (the 3GPP extremes) yield the following approximate average values of M for the cases of small N together with the read wastage (portion of the block of size N not written and re-read in next read(s) of block of size N):

| N | average M | access wastage |
|---|-----------|----------------|
| 2 | 1.55 | 23% |
| 3 | 1.82 | 39% |
| 4 | 2.50 | 37% |
| 5 | 4.00 | 20% |

Of course, as N increases, the average M access will approach N (in the limit of N equal to the block size, M=N because each datum has its own bank) and the access wastage decreases; all at the cost of more read/write circuitry. And the simulations suggest use of N greater than equal to 5 will minimize the access wastage. For example, N=8 makes N a power of 2 which may be convenient for the decision circuitry and memory bank layout.

3. Second Preferred Embodiment Interleavers

The data read in step (1) of the foregoing first preferred embodiment interleaver has to align on any data boundary and do a read of N consecutive data. This is achieved by also separating the input read memory into N banks plus accessing it in an interleaved fashion along with rotation of the order of the data points. That is, consecutive data indices correspond to consecutive data banks and, upon wraparound, consecutive addresses within banks. For the case N=2 this is analogous to the usual ping-pong memory structure. Thus the input and output data memories may have similar structures with each memory bank having its own read/write circuitry. The counter, the permutation lookup table or special circuit, and the decision/bank-allocation circuitry connect to both data banks, and with symmetry switching the interleaver can also work in the output-to-input direction.

Figure 1B:
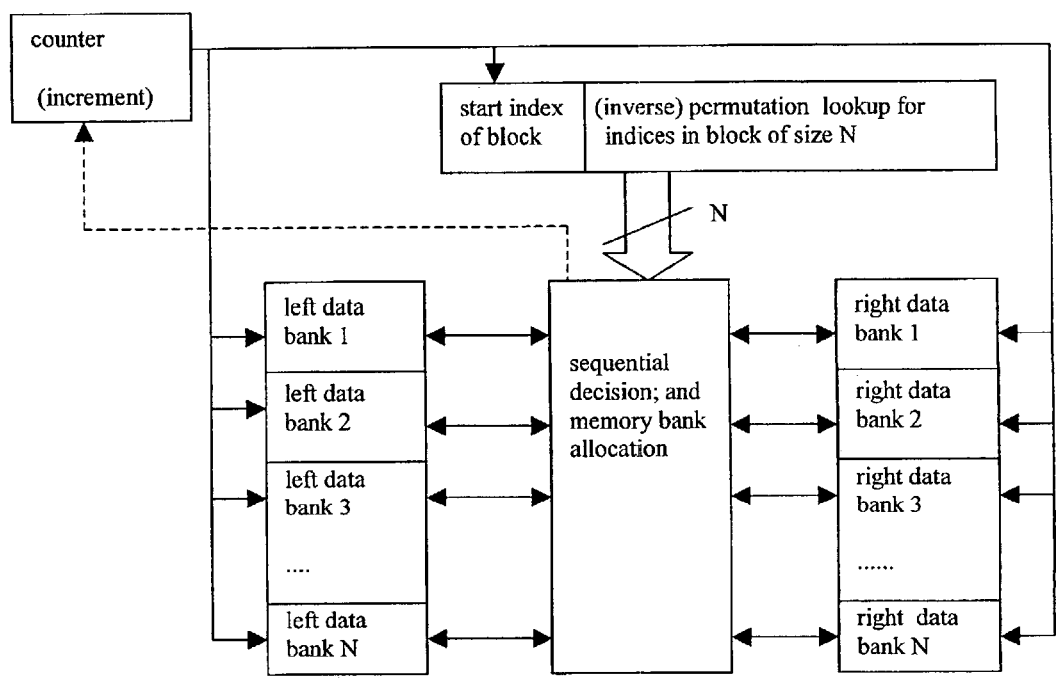

Indeed, adding an inverse permutation lookup table to the interleaver allows for totally symmetrical use as either an interleaver or de-interleaver. A block of N input data in the N left data banks is read in parallel and decisions on the corresponding N permuted or inverse-permuted indices leads to writing M data to the right data banks; and conversely when the block of N data is in the right data banks it is read in parallel, the N permuted or inverse-permuted index decisions made, and M data allocated for writing to the left data banks; see FIG. 1b.

4. Iterative MAP Decoders

FIGS. 2a–2g illustrate the 3GPP turbo encoder and an iterative decoder which includes two MAP blocks, an interleaver, a de-interleaver, and feedback for iterations. The preferred embodiments include cascade architectures for the MAP blocks; and may also include preferred embodiment interleavers and deinterleavers described in the foregoing sections. Decoders of the type of FIG. 2b generate for each encoded information symbol $u_k$ (values±1) a conditional log-likelihood (soft) output, $L(u_k|y)$, defined as:

$$L(u_k \mid y) = \log\{P(u_k = +1 \mid y)/P(u_k = -1 \mid y)\}$$

$$= \log\left\{\sum_{s':s:uk=+1} p(s', s, y) \Big/ \sum_{s':s:uk=-1} p(s', s, y)\right\}$$

where y is the received block of symbols (analog values) for a transmitted block of encoded information bits u plus parity bits x (i.e., a systematic code); information bit $u_k$ is associated with the encoder transition from state s' at time k−1 to state s at time k (transition from trellis stage k−1 to trellis stage k); and the first sum of joint probabilities is over pairs of states s',s connected by a transition with $u_k$=+1 plus the second sum of joint probabilities is over pairs of states s',s connected by a transition with $u_k$=−1. The sign of $L(u_k|y)$ then provides the hard decision (decoder estimate) for $u_k$.

The MAP blocks apply the BCJR algorithm to evaluate the joint probabilities to generate the soft values for $u_k$. In particular, the joint probabilities may be factored under the presumption of a memoryless transmission channel to yield (conditional) probabilities:

$$p(s',s,y) = p(s',y_{j<k})P(s|s')p(y_k|s',s)p(y_{j>k}|s)$$

where $y_{j<k}$ is the sequence of received symbols $y_j$ from the beginning of the block to trellis stage k−1, $y_k$ is the received symbol for the transition from stage k−1 to stage k, and $y_{j>k}$ is the received sequence for transitions from stage k to the end of the block. Alternatively, sliding windows within the block may be used. The BCJR algorithm evaluates the probability $p(s',y_{j<k})$, for convenience denoted $\alpha_{k-1}(s')$ and analogous to a (forward) state metric in a Viterbi decoder, by the recursion:

$$\alpha_k(s) = \Sigma_{s'} \gamma_k(s',s)\alpha_{k-1}(s')$$

where $\gamma_k(s',s)$ denotes $P(s|s')p(y_k|s',s)$ and is analogous to the branch metric for the transition from state s' to state s in a Viterbi decoder.

Similarly, with $p(y_{j>k}|s)$ denoted $\beta_k(s)$ and analogous to a state metric evolving backwards in time, the recursion is $$\beta_{k-1}(s') = \Sigma_s \gamma_k(s',s)\beta_k(s)$$

Trellis termination at the beginning and the ending of the block (or sliding window) provides initial conditions for $\alpha_k(s)$ and $\beta_k(s)$, respectively.

Expressing these state and branch metric analogs as their natural logarithms with $A_k(s)=\log[\alpha_k(s)]$, $B_k(s)=\log[\beta_k(s)]$, and $\Gamma_k(s',s)=\log[\gamma_k(s',s)]$ translates the recursions into:

$$A_k(s) = \log\{\Sigma_{s'} \exp[A_{k-1}(s')+\Gamma_k(s',s)]\}$$

$$B_{k-1}(s') = \log\{\Sigma_s \exp[\Gamma_k(s',s)+B_k(s)]\}$$

And thus:

$$L(u_k \mid y) = \log\left\{\sum_{s':s:uk=+1} p(s', s, y) \Big/ \sum_{s':s:uk=-1} p(s', s, y)\right\}$$

$$= \log\left\{\sum_{s':s:uk=+1} [\alpha_{k-1}(s')\gamma_k(s', s)\beta_k(s)]\right\} -$$

$$\log\left\{\sum_{s':s:uk=-1} [\alpha_{k-1}(s')\gamma_k(s', s)\beta_k(s)]\right\}$$

$$= \log\left\{\sum_{s':s:uk=+1} \exp[A_{k-1}(s') + \Gamma_k(s', s) + B_k(s)]\right\} -$$

$$\log\left\{\sum_{s':s:uk=-1} \exp[A_{k-1}(s') + \Gamma_k(s', s) + B_k(s)]\right\}$$

Presume a transmission channel model provides evaluation of the probabilities making up $\gamma_k(s',s)$, then an interpretation of the terms in this evaluation underlies the iterative decoding. In particular, presuming a Gaussian/fading channel yields (after dropping terms of $\gamma_k(s',s)$ which are branch independent and thus appear in both sums and do not contribute to $L(u_k|y)$):

$$\Gamma_k(s',s) = L_c y_{k,1} x_{k,1}/2 + L_c y_{k,2} x_{k,2}/2 + L(u_k)u_k/2$$

where $x_{k,1}$ (=$u_k$) and $x_{k,2}$ are the systematic and parity encoder outputs (values±1) for the $u_k$ input which connects states s' and s; $y_{k,1}$, $y_{k,2}$ are the received symbols for the transmitted $x_{k,1}$, $x_{k,2}$; $L_c$=4a$E_s$/$N_0$ with "a" the fading amplitude, $E_s$ the energy per symbol, and $N_0$ the noise power for a presumed transmission channel model; and $L(u_k)$ is the a priori log-likelihood of $u_k$. $L(u_k)$ generally will equal 0 due to equal a priori probabilities for $u_k$=+1 and $u_k$=−1.

The terms with $L_c y_{k,1} x_{k,1}/2$ and $L(u_k)u_k/2$ can immediately be summed over the state pairs because they are constants in each sum; this gives $$L(u_k \mid y) = L_c y_{k,1} + L(u_k) +$$

$$\log\left\{\sum_{s':s:uk=+1} \exp[A_{k-1}(s') + L_c y_{k,2} x_{k,2}/2 + B_k(s)]\right\} -$$

$$\log\left\{\sum_{s':s:uk=-1} \exp[A_{k-1}(s') + L_c y_{k,2} x_{k,2}/2 + B_k(s)]\right\}$$

$$= L_c y_{k,1} + L(u_k) + W_k$$

where $W_k$ is defined by the log terms. These three terms represent decoding three independent sources of information about $u_k$: (1) $L_c y_{k,1}$ is the direct information from decoding the received systematic symbols $y_{k,1}$, (2) $L(u_k)$ is a priori information about the distribution of $u_k$ values, and (3) $W_k$ is the "extrinsic" information obtained by including the received parity symbols $y_{k,2}$ in the decoding. FIG. 2b illustrates this with the three inputs to the leftside MAP block: (i) the received systematic symbols $y_{k,1}$, (ii) the received parity symbols $y_{k,2}$ from the upper convolution encoder of FIG. 2a, and (iii) a priori information about $u_k$ as initial input at the a priori information input. The leftside MAP block performs the BCJR computation from these three inputs to find $A_k(s)$, $B_k(s)$, and $W_k$, and the block outputs $W_k$ to the a priori information input of the rightside MAP block.

Next, the rightside MAP block of FIG. 2b performs the BCJR computations from three inputs: (i) the interleaved received systematic symbols (interleaved $y_{k,1}$), (ii) the received parity symbols $y'_{k,2}$ from the lower convolution encoder of FIG. 2a which encodes an interleaved input, and (iii) the interleaved extrinsic information (interleaved $W_k$)

from the leftside MAP block at the a priori information input. These three are again independent information about $u_k$, and the rightside MAP block performs the BCJR computation for $A_k(s)$, $B_k(s)$, and $W_k$, but with a branch metric updated with further information by the use of $W_k$ as the a priori information:

$$\Gamma^{(1)}_k(s',s) = L_c y'_{k,1} x'_{k,1}/2 + L_c y'_{k,2} x'_{k,2}/2 + W'_k u'_k/2$$

This generates interleaved new state metrics $A'^{(1)}_k(s)$ and $B'^{(1)}_k(s)$ and interleaved new extrinsic information $W'^{(1)}_k$ which amounts to updated interleaved soft information about $u_k$:

$$L'^{(1)}(u_k \mid y) = L_c y'_{k,1} + W'_k +$$
$$\log\left\{\sum_{s':s:uk=+1} \exp[A'^{(1)}_{k-1}(s') + L_c y'_{k,2} x'_{k,2}/2 + B'^{(1)}_k(s)]\right\} -$$
$$\log\left\{\sum_{s':s:uk=-1} \exp[A'^{(1)}_{k-1}(s') + L_c y'_{k,2} x'_{k,2}/2 + B'^{(1)}_k(s)]\right\}$$
$$= L_c y'_{k,1} + W'_k + W'^{(1)}_k$$

where the interleaved new extrinsic information $W'^{(1)}_k$ is also defined as the log terms. The rightside MAP outputs $W'^{(1)}_k$ which is de-interleaved and fed back to the a priori information input of the leftside MAP.

The leftside MAP now repeats its BCJR computation but with the de-interleaved extrinsic information $W^{(1)}_k$ replacing the original a prior information; that is, with updated branch metric;

$$\Gamma^{(2)}_k(s',s) = L_c y_{k,1} x_{k,1}/2 + L_c y_{k,2} x_{k,2}/2 + W^{(1)}_k u_k/2$$

Again, this generates new state metrics $A^{(2)}_k(s)$ and $B^{(2)}_k(s)$ plus new extrinsic information $W^{(2)}_k$ and thus updated soft information $L^{(2)}(u_k|y) = L_c y_{k,1} + W^{(1)}_k + W^{(2)}_k$. New extrinsic information $W^{(2)}_k$ then (after interleaving) feeds the a priori information input of rightside MAP, and so forth for subsequent iterations.

Figure 2A:
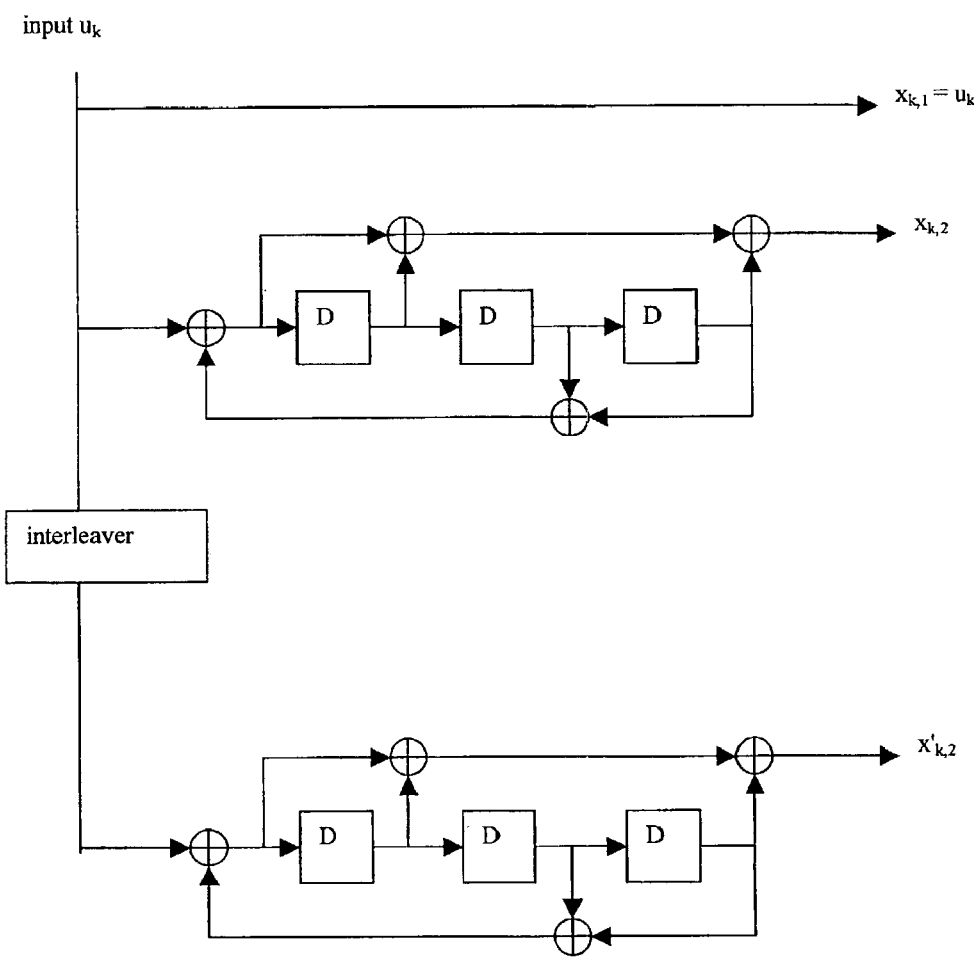
Figure 2B:
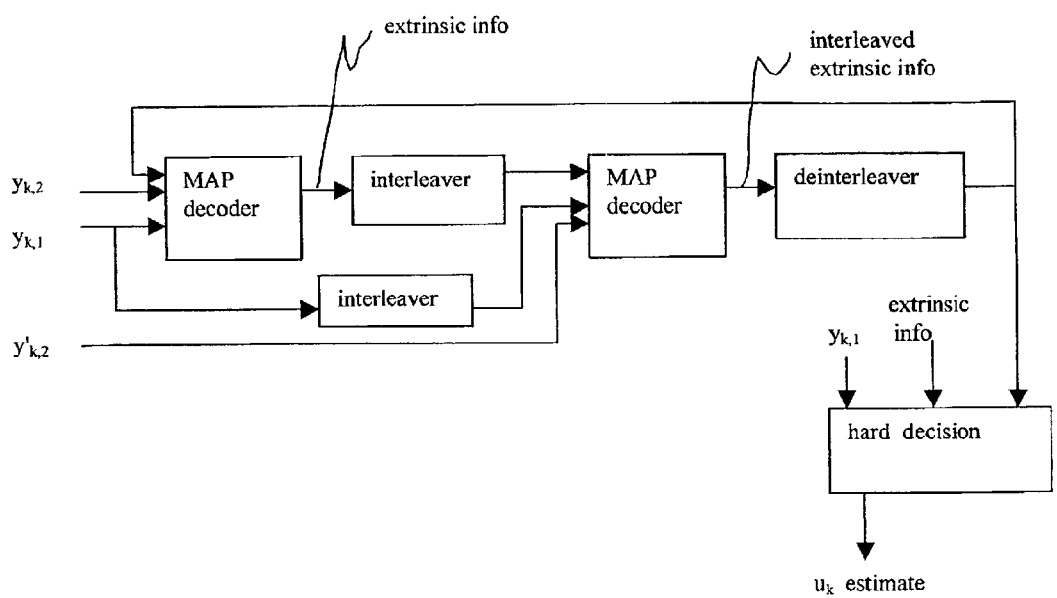
Figure 2C:
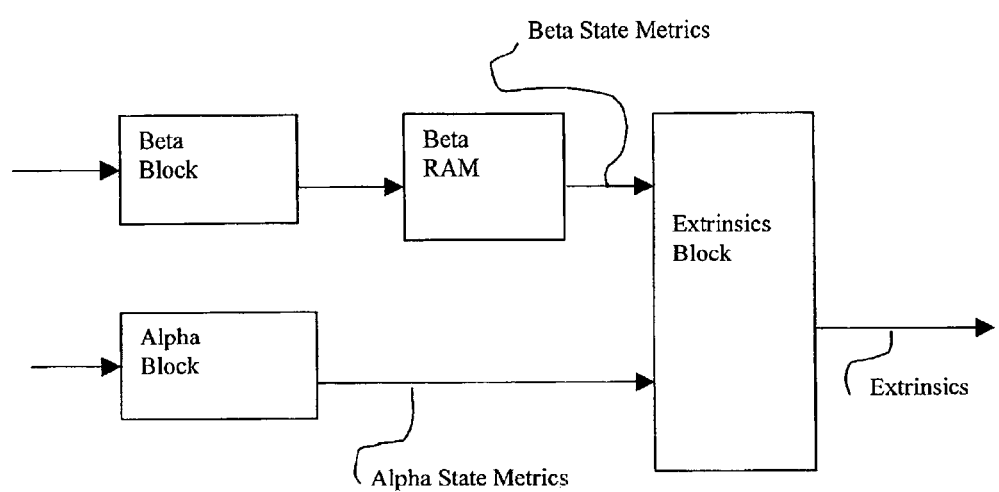

As shown in FIG. 2c, each MAP block calculates three vectors: beta state metrics $B_k(s)$, alpha state metrics $A_k(s)$, and extrinsics $W_k$ from soft input values of random variables. In particular, each MAP block has soft inputs of (1) received information symbols, (2) received parity symbols, and (3) extrinsic information from the other MAP block and with a priori information as the initial condition. The MAP block outputs extrinsic information.

As shown by the foregoing, implementation of the MAP block requires evaluation of the function $\log\{\Sigma_j \exp[z_j]\}$ for various sums. This function roughly picks out the largest $z_j$ and is called the max* function. For the case of only two terms in the sum (as arises from a trellis with only two branches entering or leaving a state), the function is defined as:

$$\text{max*}(a,b) = \log\{\exp[a] + \exp[b]\}$$
$$= \max(a,b) + \log\{1 + \exp(-|a-b|)\}$$

The max* function may be implemented as a max circuit plus a small lookup table for approximating the log $\{1+\exp(-|a-b|)\}$ term.

In terms of max* the BCJR recursions become $$A_k(s) = \text{max*}(A_{k-1}(s') + \Gamma_k(s',s), A_{k-1}(s'') + \Gamma_k(s'',s))$$

$$B_{k-1}(s) = \text{max*}(\Gamma_k(s,s') + B_k(s,s'), \Gamma_k(s,s'') + B_k(s''))$$

where s' and s" are the two states connecting to state s, in the forward direction for the $A_k(s)$ recursion and in the backward direction for the $B_{k-1}(s)$ recursion; FIG. 2g illustrates the adders plus max* circuitry for the A recursion. FIGS. 2d–2e illustrate the implementation of the recursions with parallel max* blocks. For a trellis with $2^n$ states the alpha and beta blocks each have $2^n$ max* circuits: one for each state as illustrated by the foregoing recursions.

The $W_k$ computation $$W_k = +\log\left\{\sum_{s':s:uk=+1} \exp[A_{k-1}(s') + L_c y_{k,2} x_{k,2}/2 + B_k(s)]\right\} -$$
$$\log\left\{\sum_{s':s:uk=-1} \exp[A_{k-1}(s') + L_c y_{k,2} x_{k,2}/2 + B_k(s)]\right\}$$
$$= +\text{max*}_{s':s:uk=+1}[A_{k-1}(s') + L_c y_{k,2} x_{k,2}/2 + B_k(s)] -$$
$$\text{max*}_{s':s:uk=-1}[A_{k-1}(s') + L_c y_{k,2} x_{k,2}/2 + B_k(s)]$$

evaluates two max* functions, each with $2^n$ inputs for a trellis with $2^n$ states. Implementation of such a max* function can be by a pyramid of 2-input max* blocks with $2^{n-1}$ max* blocks at the first level.

The encoder illustrated in FIG. 2a has eight states and each state has one branch for $u_k=+1$ and one branch for $u_k=-1$, so the $W_k$ sums each have eight terms, and implementation of the extrinsic information computations requires two pyramids of seven max* blocks each as illustrated in FIG. 2f.

In general, a parallel decoder for a trellis with $2^n$ states has alpha and beta blocks which each require $2^n$ max* blocks (one for each state's metric) and an extrinsics block which requires $2(2^n-1)$ max* blocks (the max* of $2^n$ inputs may be computed by a pyramid of $(2^n-1)$ 2-input max* blocks).

Typically MAP decoders partition a sequence of received symbols into sliding windows for simpler processing. In the MAP decoder of FIG. 2c first the beta state metrics for the trellis stages of the first sliding window are generated and stored in the beta state metric RAM. Next, the beta block processes the trellis stages of the second sliding window while the alpha block processes the trellis stages of the first sliding window. The alpha block does not need to save its state metrics at each stage because it sends its state metrics (first sliding window) to the extrinsics block. Also, the beta state metric RAM is read at the same time and its beta state metrics for that stage (first sliding window) are sent to the extrinsic block. The extrinsic block computes the extrnsics for that stage from the alpha, beta, and gamma data for the first sliding window. The decoder repeats this procedure for the second and subsequent sliding windows.

5. Preferred Embodiment MAP Blocks

The preferred embodiment MAP blocks use a cascade architecture for the alpha, beta, and extrinsic blocks as illustrated by the examples of FIGS. 3a–3g for a 16-state trellis. Cascade architecture may require fewer max* blocks than the corresponding parallel processing blocks of FIGS. 2d–2f due to the sequential computations over subsets of the states. Indeed, each ACS unit (adders plus max* blocks)

does not correspond to a single state metric but rather cycles through the state metrics for a subset of states.

For example, consider a 16-state trellis decoder with the 16 states partitioned into two subsets of 8 states, so 8 state metrics are computed in parallel. FIG. 3a shows an alpha block including four radix-4 ACS units (R4), transpose blocks, and a switch block. The alpha block operates as follows. Each R4 block has four log state metric ($A_{k-1}$) inputs and four log branch metric ($\Gamma_k$) inputs which are added and max* applied to butterfly pairs (see foregoing recursions) to output from the four max* units four log state metrics ($A_k$). In particular, label the 16 states (and their log state metrics) from 0 to 15 with a trellis stage eliminating the most significant bit of and adding a new least significant bit to the labels, then the 16 log state metrics are partitioned at the lefthand edge of FIG. 3a as log state metrics 0,1,8,9 input to the upper R4 and log state metrics 2,3,10,11 input to the lower R4. These inputs (plus corresponding log branch metrics) lead to output log state metrics 0,1,2,3 from the upper left R4 and log state metrics 4,5,6,7 from the lower left R4 during the first computation cycle. Explicitly, computations of output log state metrics 0,1 require inputs of log state metrics 0,8 with two max* units, and computations of output log state metrics 2,3 require input log state metrics 1,9 with two max* units, and the upper left R4 performs both of these computation (butterflies) in the first computation cycle. Similarly, the lower left R4 performs two butterfly computations during the first computation cycle: output 4,5 from inputs 2,10 and outputs 6,7 from inputs 3,11. These eight output log state metrics are stored. During the second computation cycle the upper left R4 computes outputs 8,9 from inputs 4,12 and outputs 10,11 from inputs 5,13 with the same four max* units as used during the first computation cycle. Similarly the lower left R4 computes outputs 12,13 from inputs 6,14 and outputs 14,15 from inputs 7,15 during the second computation cycle; see lefthand portion of FIG. 3b. Thus after the two computation cycles all 16 log state metrics $A_k(s)$ have been computed from the prior 16 log state metrics $A_{k-1}(s)$ (i.e., one trellis stage) with only 8 max* units by splitting the computation into the two computation cycles. Note that generally with 16 states, for m=0, 1, ..., 7 states m and m+8 at stage k branch to states 2m and 2m+1 at stage k+1 and form a butterfly. Thus states 0,8 branch to states 0,1; states 1,9 branch to states 2,3; and so forth.

Next, after the two computation cycles, the eight output log state metrics from an R4 are treated as a 2×2 matrix of pairs (2×1) of log state metrics, and each matrix is transposed prior to use as inputs to the second two R4's for the computation of the $A_{k+1}(s)$ from the just-computed $A_k(s)$. In particular, the upper left R4 output log state metrics 0,1,2,3 in the first cycle and log state metrics 8,9,10,11 in the second cycle; so the transpose yields the log state metrics organized as 0,1,8,9 and then 2,3,10,11. Similarly for the lower R4 outputs 4,5,6,7 and 12,13,14,15 transpose to 4,5,12,13 and 6,7,14,15. This reorganizes the log state metrics for computations by the righthand R4's. The transpose amounts to a data shuffle when the inputs to the R4's are considered the contents of fixed memory locations.

Then for the k to k+1 trellis stage the righthand two R4's perform butterfly computations analogous to the foregoing for the k−1 to k trellis stage: More explicitly, in a first computation cycle the upper right R4 outputs 0,1 from inputs 0,8 and outputs 2,3 from inputs 1,9 (same as the first cycle for the upper left R4), and the lower right R4 outputs 8,9 from inputs 4,12 and outputs 10,11 from inputs 5,13 (same as the second cycle for the upper left R4). Similarly during the second computation cycle the upper right R4: outputs 4,5 from inputs 2,10 and outputs 6,7 from inputs 3,11 (same as lower left R4 during the first cycle); and the lower right outputs 12,13 from inputs 6,14 and outputs 14,15 from inputs 7,15 (same as lower left R4 during second cycle).

Lastly, switches S4 swap first cycle outputs 2,3 and 8,9 and swap second cycle outputs 6,7 and 12,13; again, this swap is a data relocation. This reorganizes the log state metrics for input to the lefthand R4's for the next trellis stage computations. This completes one loop in FIG. 3a, and FIG. 3b illustrates the log state metric computations and relocations step-by-step: the first and second computation cycles use the log state metrics with labels left and right of the broken vertical lines, respectively, in each set of 8 metric labels.

There are two possible cascade architectures for generating the beta log state metrics. The first architecture allows the data to flow in the same direction as the alpha data flow as illustrated in FIGS. 3c–3d, and the second architecture reverses the data flow as illustrated in FIGS. 3e–3f. Both architectures send the beta data to the beta block in reverse order. Both architectures also change the adder functions in the R4 block to support the beta computations.

In the preferred embodiment cascade architectures only portions of the entire state metrics are generated during each computation cycle due to the reuse of the R4 blocks and simplified routing; but the correct combinations of alpha state metrics and beta state metrics are to be sent to the extrinsics block. For example, the 16-state case partitioned into two computation cycles described in connection with FIGS. 3a–3f has the following combinations.

| Extrinsics set | Alpha log state metrics | Beta log state metrics |
| --- | --- | --- |
| 1 | 0, 1, 8, 9 | 0, 1, 2, 3 |
| 2 | 2, 3, 10, 11 | 4, 5, 6, 7 |
| 3 | 4, 5, 12, 13 | 8, 9, 10, 11 |
| 4 | 6, 7, 14, 15 | 12, 13, 14, 15 |

These combinations are simply the pairs of trellis butterflies used by the R4's in the forward and reverse directions and represent the branches for $u_k=\pm 1$ which are the pairs of states summed for $W_k$. In particular, for the alpha state metrics and first architecture beta state metrics these are the outputs immediately after either the transpose by $T_{2\times 1}$ or the swap by S4 (see FIGS. 3b, 3d).

To align these outputs in correct extrinsics block order, the outputs after the transpose $T_{2\times 1}$ of the alpha combine with the outputs after swap by S4 of the beta and, conversely, the after S4 outputs of the alpha combine with the after $T_{2\times 1}$ outputs of the beta. For example, during the first computation cycle after transpose $T_{2\times 1}$ the alpha state metric outputs are 0,1,8,9 (upper loop) plus 4,5,12,13 (lower loop), whereas after the swap by S4 the beta state metric outputs are 0,1,2,3 (upper loop) and 8,9,10,11 (lower loop). Thus the upper loop outputs (0,1,8,9 for alpha and 0,1,2,3 for beta) and the lower loop outputs (4,5,12,13 for alpha and 8,9,10,11 for beta) fit extrinsics sets 1 and 3, respectively. In short, the leftside R4 stage of the alpha block in FIG. 3b corresponds to the rightside R4 stage of the beta block of FIG. 3d, and the rightside R4 stage of the alpha block corresponds to the leftside R4 stage of the beta block.

Similarily, during the second computation cycle the outputs after $T_{2\times 1}$ of alpha are 2,3,10,11 and 6,7,14,15 and the outputs after S4 of beta are 4,5,6,7 and 12,13,14,15. Thus the upper loop outputs (2,3,10,11 for alpha and 4,5,6,7 for beta) and the lower loop outputs (6,7,14,15 for alpha and 12,13, 14,15 for beta) fit extrinsics sets 2 and 4, respectively. That is, the leftside R4 stage of the alpha block of FIG. 3*b* corresponds to the leftside R4 stage of the beta block of FIG. 3*f,* and the rightside R4 stages also correspond.

Analogously, the S4 outputs of alpha and the $T_{2\times1}$ outputs of beta fit extrinsics sets 1–2 and 3–4 during the first and second computation cycles, respectively.

FIG. 3*g* shows a preferred embodiment extrinsic subblock (implementing one of the two log functions of the extrinsics) which may be used in the cascade MAP blocks of FIGS. 3*a*–3*f* with 16 states partitioned as two 8 state subsets with a subset the 8 inputs to the adders. And each R4 stage input connects to an extrinsics block, so the cascades of FIGS. 3*a*–3*f* each have two extrinsics blocks (each made of two subblocks as in FIG. 3*g*) for each R4. The feedback on the last max* unit accumulates over the computation cycles.

Extending the foregoing (a cascade with 2 R4's in a stage) to larger trellis sizes illustrates the preferred embodiment cascade circuit simplicity in terms of number of max* blocks required as compared to the number of max* blocks required by fully parallel circuits as in FIGS. 2*d*–2*f*. In particular, the following numbers of 2_input max* blocks obtain.

| Trellis size (states) | α/β blocks | Parallel extrinsic block | total | α/β blocks | Cascade extrinsic block | total |
|---|---|---|---|---|---|---|
| 16 | 2 × 16 | 15 × 2 = 30 | 62 | 2 × 16 | 8 × 2 × 2 = 32 | 64 |
| 32 | 2 × 32 | 31 × 2 = 62 | 126 | 2 × 24 | 8 × 2 × 3 = 48 | 96 |
| 64 | 2 × 64 | 63 × 2 = 126 | 254 | 2 × 32 | 8 × 2 × 4 = 64 | 128 |
| 128 | 2 × 128 | 127 × 2 = 254 | 510 | 2 × 40 | 8 × 2 × 5 = 80 | 160 |
| 256 | 2 × 256 | 255 × 2 = 510 | 1022 | 2 × 48 | 8 × 2 × 6 = 96 | 192 |

The extensions to larger trellises is by increasing the number of columns with the columns continuing to contain 8 states (4 states for each of two R4's). The number of R4's (number of stages in the cascade) must be increased to provide the extra permutations of the larger trellis. In particular, each increase by a factor of 2 in the trellis size requires one additional cascade stage with its pair of R4's (8 max* circuits as indicated in the table). And the 8 inputs to each pair of R4's also feed one 8-input extrinsics block which includes two circuits as in FIG. 3*g*; thus the equation 8×2×n for a cascade with n R4-pair stages. For example, FIG. 4 illustrates the alpha block for the trellis size 32 with three pairs of R4's.

6. Second Cascade Architecture

The 16 states of the trellis of the decoder illustrated in FIGS. 3*a*–3*g* can alternatively be partitioned as four columns of four states (4×4 matrix) for a cascade architecture with six R2's. In particular, FIGS. 5*a*–5*c* illustrate the processing of state metrics in the alpha block, beta block, and extrinsic block, respectively (computations left to right or right to left). The R2's operate as previously described on a column of two log state metrics of a butterfly by addition of log branch metrics and max* for each output. The switch interchanges two rows; whereas, the T1 and T2 transposes interchanges 1×1 and 1×2 submatrices.

FIG. 5*b* shows the corresponding beta block, and FIG. 5*c* the extrinsics block.

7. Modifications

The preferred embodiments may be varied while retaining one or more of the features of a quasi-parallel interleaver and a cascade architecture for MAP decoding.

For example, a MAP decoder for a trellis of size $2^{n+m}$ can be factored into subsets of size $2^n$ and use alpha and beta blocks having a cascade architecture with K(=m+1) stages and $2^m$ computation cycles (plus transpositions) per stage and K $2^n$-input extrinsics blocks.

What is claimed is:

1. A MAP decoder with cascaded architecture for reducing numbers of circuits, comprising:
   (a) inputs for receiving symbols;
   (b) a forward recursion block coupled to said inputs, said forward recursion block with cascade architecture;
   (c) a backward recursion block coupled to said inputs; said backward recursion block with cascade architecture; and
   (d) an output block coupled to said forward recursion block and to said backward recursion block.

2. The decoder of claim 1, wherein:
   (a) said forward recursion block includes first parallel add-compare-select (ACS) units, second parallel ACS units, and a first transformation unit connecting the outputs of said first ACS units to inputs of said second ACS units;
   (b) said backward recursion block includes third parallel ACS units, fourth parallel ACS units, and a second transformation unit connecting the outputs of said first ACS units to inputs of said second ACS units; and
   (c) said output block couples to the inputs of said ACS units and to said inputs for receiving symbols.

3. The decoder of claim 1, further comprising:
   (a) an input for extrinsic information coupled to said forward recursion and backward recursion blocks.

4. A MAP decoder with cascaded architecture for reducing numbers of circuits, comprising:
   (a) inputs for receiving symbols from an encoder with $2^{n+m}$ states where n and m are positive integers;
   (b) a forward recursion block coupled to said inputs, said forward recursion block with m+1 first sets of add-compare-select (ACS) units, each of said first sets including $2^n$ ACS units in parallel, said m+1 first sets coupled in series with feedback;
   (c) a backward recursion block coupled to said inputs, said backward recursion block with m+1 second sets of ACS units, each of said second sets including $2^n$ ACS units in parallel, said m+1 second sets coupled in series with feedback; and
   (d) an output block coupled to said first sets and said second sets of ACS units.

5. The decoder of claim 4, wherein:
   (a) each of said ACS units includes 1 2-input max* block; and
   (b) said output block includes $2(m+1)2^n$ 2-input max* blocks.

6. A turbo decoder with cascaded architecture for performing channel coding, comprising,
   (a) a first MAP decoder with inputs for receiving symbols and extrinsic information;
   (b) a first interleaver coupled to an output of said first MAP decoder;

(c) a second interleaver coupled to said inputs for receiving symbols;
(d) a second MAP decoder with inputs coupled to outputs of said first and said second interleavers and to said inputs for receiving symbols;
(e) a deinterleaver coupled to an output of said second MAP decoder; and
(f) a decision unit coupled to said inputs for receiving symbols and outputs of said first MAP decoder and of said deinterleaver;
(g) wherein said first and said second MAP decoders each includes (i) a forward recursion block, said forward recursion block with cascade architecture;
(ii) a backward recursion block, said backward recursion block with cascade architecture, and (iii) an output block coupled to said forward recursion block and to said backward recursion block.

7. The decoder of claim 6, wherein:
(a) the output of said deinterleaver couples to said input for extrinsic information of said first MAP decoder to provide feedback for iterative operation.

* * * * *